United States Patent [19]

Hayes

[11] Patent Number: 4,981,808

[45] Date of Patent: Jan. 1, 1991

[54] PROCESS FOR THE MANUFACTURE OF III-V SEMICONDUCTOR DEVICES

[75] Inventor: Roger C. Hayes, Northampton, England

[73] Assignee: Plessey Overseas Limited, Ilford, England

[21] Appl. No.: 298,881

[22] PCT Filed: Mar. 26, 1987

[86] PCT No.: PCT/GB87/00208

§ 371 Date: Jan. 12, 1989

§ 102(e) Date: Jan. 12, 1989

[87] PCT Pub. No.: WO87/06061

PCT Pub. Date: Oct. 8, 1987

[30] Foreign Application Priority Data

Mar. 26, 1987 [GB] United Kingdom ............... 8707321

[51] Int. Cl.[5] .................................. H01L 21/90
[52] U.S. Cl. .................................. 437/31; 437/33; 437/41; 437/126; 437/133; 437/90; 437/91; 437/107; 148/DIG. 11; 148/DIG. 65; 148/DIG. 72
[58] Field of Search ............... 437/31, 33, 126, 909, 437/133, 41, 90, 91, 107, 32; 148/DIG. 10, DIG. 11, DIG. 84, DIG. 72, DIG. 65; 357/16, 34, 56

[56] References Cited

U.S. PATENT DOCUMENTS

| 3,780,359 | 12/1973 | Dumke et al. | 148/DIG. 72 |
| 4,028,140 | 6/1977 | Summers et al. | 357/56 |
| 4,099,987 | 7/1978 | Jambotkar | 437/51 |
| 4,262,296 | 4/1981 | Shealy et al. | 437/160 |
| 4,292,156 | 9/1981 | Matsumoto et al. | 357/56 |
| 4,379,005 | 4/1983 | Hovel et al. | 357/16 |
| 4,619,036 | 10/1986 | Havemann et al. | 148/DIG. 10 |
| 4,731,340 | 3/1988 | Chang et al. | 357/16 |

FOREIGN PATENT DOCUMENTS

| 0188897 | 7/1986 | European Pat. Off. | 148/DIG. 10 |
| 0123724 | 7/1983 | Japan | 437/31 |

Primary Examiner—Brian E. Hearn
Assistant Examiner—Tuan Nguyen
Attorney, Agent, or Firm—Fleit, Jacobson, Cohn, Price, Holman & Stern

[57] ABSTRACT

A process for the manufacture of a transistor device of the type having active regions e.g. an emitter (17) and a base (11) each contacted by isolated extended conductive regions (37, 33) respectively. At start of process a mesa structure is defined in layered III-V material (3, 5, 11 and 13). The sidewall of the mesa is covered by a conformal coating (27) of insulating material; and, lattice matched material (33) grown on the exposed adjacent material (25) to form a first extended contact. This then is covered by a further layer (35) of insulating material (35). The second extended contact (37) is then grown over the mesa active region material (13). This contact material (37) is isolated from the first contact material (33) by the remanent insulating material (27, 35). This process is applicable to the GaAs/GaAlAs III-V material system as also other material systems. Transistor devices produced by this process may be either bipolar or field-effect type.

7 Claims, 7 Drawing Sheets

PROCESS FOR THE MANUFACTURE OF III-V SEMICONDUCTOR DEVICES

TECHNICAL FIELD

The present invention concerns improvements in or relating to processes for the manufacture of III-V semiconductor devices—e.g. bipolar and field-effect transistor devices. Especially, reference will be made to gallium arsenide (GaAs)/gallium aluminium arsenide (GaAlAs) heterostructure bipolar transistors. Other III-V homostructure and heterostructure materials, however, will be mentioned as also other device types.

BACKGROUND ART

The theoretical performance advantages of gallium arsenide (GaAs)/gallium aluminium arsenide (GaAlAs) III-V bipolar transistors over their silicon counterparts are well known. At present, however, higher bipolar circuit speeds have been obtained for silicon devices. There is one reason for this discrepancy: highly advanced silicon technology makes possible the fabrication of devices of extremely small size hitherto unattainable with current GaAs processes. In particular, the "Super Self-Aligned" process (Sakai T., et al., "Prospects of SSI technology for high speed LSI", IEDM 1985, Tech. Dig., p18.) represents the state of the art for silicon.

There are considerable obstacles to the realisation of such a process in GaAs; silicon has intrinsic advantages such as a native oxide, the possibility of polycrystalline silicon overgrowth for extended contacts and impurity diffusion, and a common contact metallurgy for p-type and n-type regions. Published schemes for self-alignment of GaAs/GaAlAs bipolar devices (e.g. Asbeck P.M., "Heterojunction Bipolar Transistors", IEDM 1985, Short course: Digital III-V Device and Circuit Technology", course notes p114., and, Izawa T., et al., "AlGaAs/GaAs Heterojunction Bipolar Transistors", IEDM 1985, Tech. Dig., p328.) have suffered from difficulties involved in contacting the base layer due to the need to remove any parasitic GaAs/GaAs homojunction regions between emitter and base. Achieving a low contact resistance to the emitter is also problematic. Scaling to the dimensions typified by the self-aligned silicon device (above) presents great problems in these schemes.

DISCLOSURE OF THE INVENTION

The present invention is intended as a remedy to the problems outlined above and provides a process suited for producing highly self-aligned devices with small feature geometry, i.e. devices, comparable thus in geometry and size to state-of-the-art silicon devices.

In accordance with this invention, thus, there is provided a process for the manufacture of a III-V semiconductor device, this process including the steps of:
providing a III-V semiconductor structure;
forming, upon an exposed surface of this structure, a masking area of insulating material;
applying an etch to remove surplus material adjacent to the masking area;
forming upon the insulating material, the side of the structure exposed by the etch, and, the surface of the underlying material exposed by the etch, a further and conformal layer of insulating material;
applying an anisotropic etch to remove the insulating material covering the underlying material whilst leaving insulating material covering the top and side aforesaid; growing a layer of lattice matched material upon the surface of the underlying material thus exposed, the same to provide a first extended contact region, the upper surface of this grown layer lying below the top of the structure aforesaid;
forming, upon the surface of the grown layer, a covering layer of insulating material; and,
forming a second extended contact region lying above the top of the structure aforesaid.

In the manner aforesaid insulation is provided between the first and second extended contacts by means of overgrown insulating material. Also, insulation is afforded between the structure material aforesaid and the first extended contact by the sidewall insulating material remaining following the anisotropic etch.

In the method aforesaid and in particular for bipolar transistor manufacture, the growth of the lattice matched material for extended contact formation may be preceded by masked implantation, this step being essential to afford electrical continuity to a buried base layer, part of the structure.

The composition of the III-V semiconductor structure, insulating materials and extended contact materials may be varied as appropriate, depending on device type and application. Alternatives will be considered in the description that follows.

BRIEF INTRODUCTION OF THE DRAWINGS

In the drawings accompanying this specification:

DESCRIPTION OF PREFERRED EMBODIMENTS

So that this invention may be better understood, embodiments of the invention will now be described and reference will be made to the accompanying drawings. The description that follows is given by way of example only.

Figure 1:
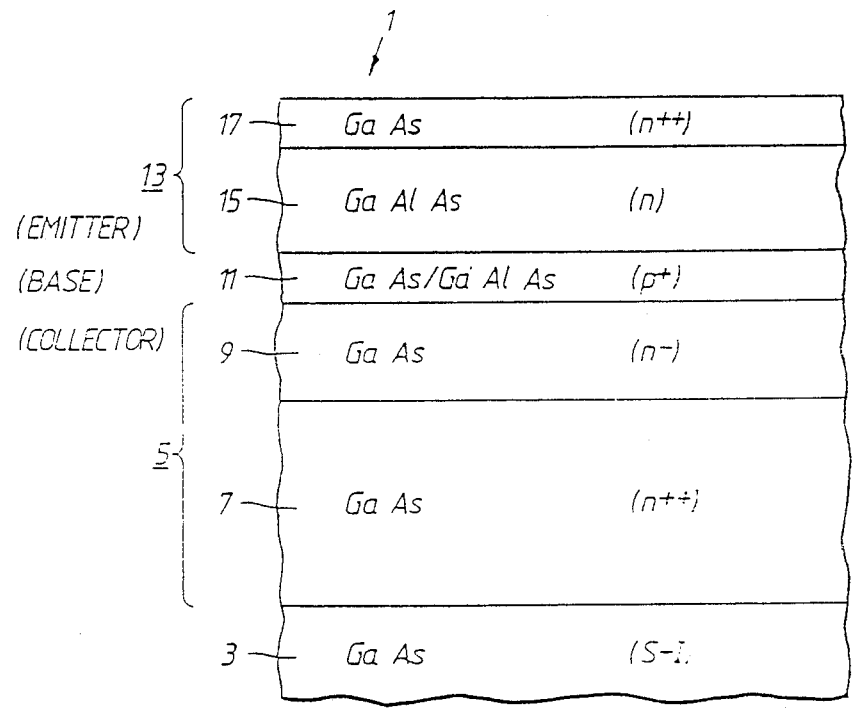
FIGS. 1 to 7 are cross-sections showing heterostructure geometry at successive stages of a process applied in accord with the present invention, the same resulting in a bipolar transistor device.

The process described below permits the fabrication of all active areas and contacts to those areas of a transistor using a single masking step; a second mask defines the base-collector junction area with a single alignment. The steps in device fabrication may be as follows (refer to attached drawings): The starting material structure for the process is a conventional GaAs/GaAlAs bipolar epitaxial heterostructure (a typical configuration 1 is shown in FIG. 1). The starting structure 1 shown comprises a substrate 3 of crystalline semi-insulating gallium arsenide material bearing a succession of epitaxially grown layers arranged for providing n-p-n vertical transistor structure. These comprise one or more n-type collector layers 5, namely a dopant enriched (n++) layer 7 and a lightly doped (n−) layer 9 both of gallium arsenide material. These layers 7, 9 are covered by a base layer 11 of dopant enriched p-type (p+) gallium arsenide material graded to gallium aluminium arsenide material uppermost. This is then followed by emitter layers 13, namely an n-type gallium aluminium arsenide layer 15 and a dopant enriched n-type (n++) gallium arsenide capping layer. (It is noted that other structural arrangements could be used for example those for providing p-n-p vertical transistor structure, as also more complex layered structures, e.g. n-p-n-p; p-n-p-n; p-n-p-n-p-n and n-p-n-p-n-p as requisite for n-p-n and p-n-p complimentary transistor structures.)

Figure 2:
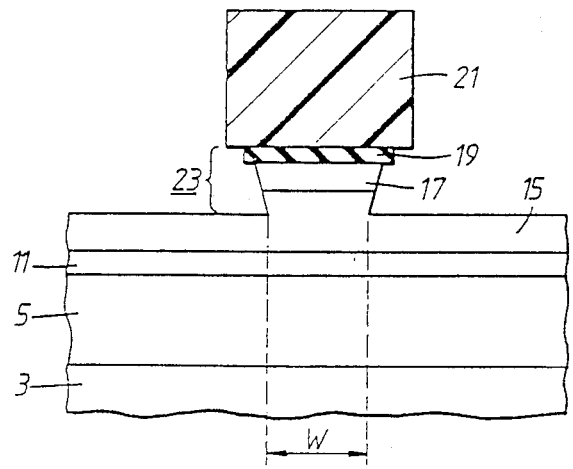
Figure 3:
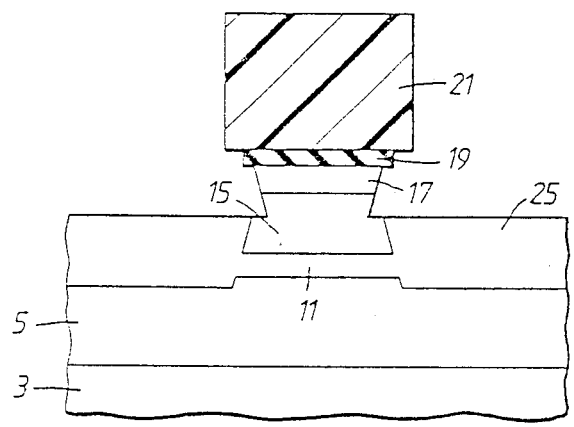

This structure 1 is coated with silicon dioxide (silox) dielectric 19 and a photolithograhic photoresist 21 masking step used to define a feature 23. This step determines the emitter width W of the finished device. The silox 19 (with photoresist 21 still present) is then used as a mask to etch the epilayer structure 15, 17 down as far as the GaAlAs region 15 of the emitter 13 (FIG. 2). A p-type ion implantation step can then be carried out (masked by the photoresist 21) to form a contact 25 to the base layer 11 (FIG. 3). In the structure, no GaAs contact layer is needed for the base 11 since no metallisation is to be applied directly; therefore no parasitic GaAs/GaAs homojunction is present.

Figure 4:
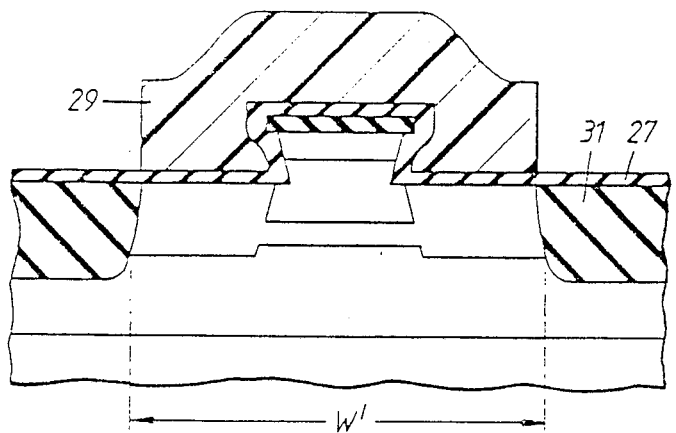

After photoresist 21 removal the whole structure 1 is coated with silox 27 once more. This layer 27 can serve as the encapsulant for annealing of the p-type implant 25. A second photoresist 29 masking step aligned to the etched mesa feature 23, is then applied and an isolating implant 31 is used to define the base-collector junction area, width W' of this area being shown (FIG. 4). After photoresist 29 removal a highly anisotropic reactive ion etching step will remove the silox 27 from the p-type GaAlAs 25 surface. The entire emitter 13 will remain coated; the sidewalls are not affected by the anisotropic etch and the top has a double thickness of silox 19, 27 prior to etching.

Figure 5:
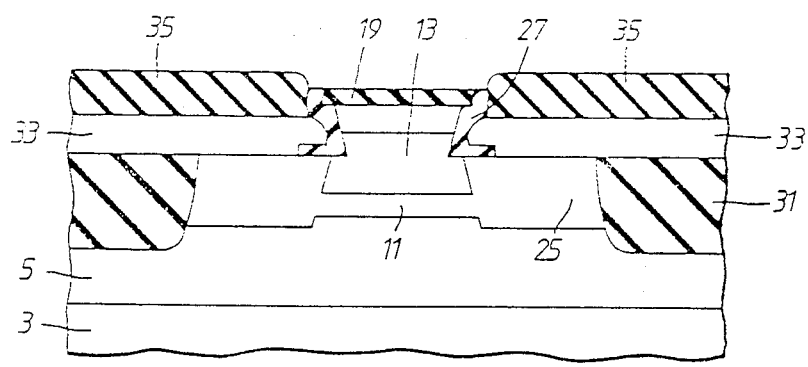
Figure 6:
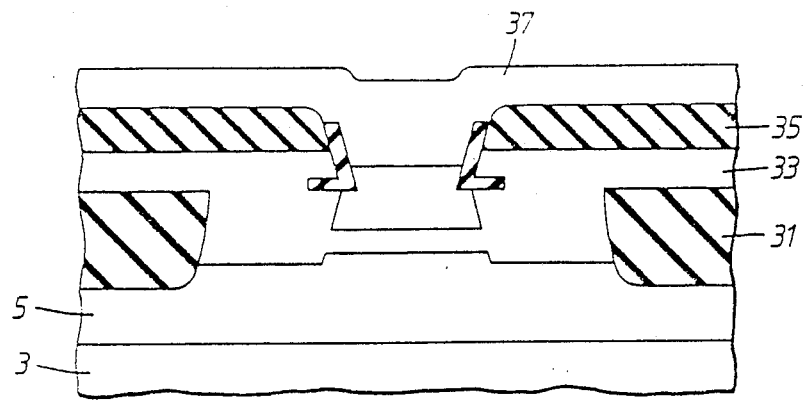

The next step is crucial to device fabrication. The GaAs wafer 1 is put back into an epitaxial layer growth apparatus and a p-type GaAs contacting layer 33 grown for the base 11. With the correct growth conditions GaAs will not nucleate on the silox-coated 19, 27 emitter 13. To achieve isolation between emitter contacts and base contacts, a layer 35 of semi-insulating material (typically GaAlAs) is overgrown on the p-layer 33. The structure then appears as shown in FIG. 5. After removal from the growth apparatus etching will remove the exposed silox layer 19 on the emitter 13; a further epitaxial growth step is then used to produce an n-type GaAs contacting layer 37 (FIG. 6).

Figure 7:
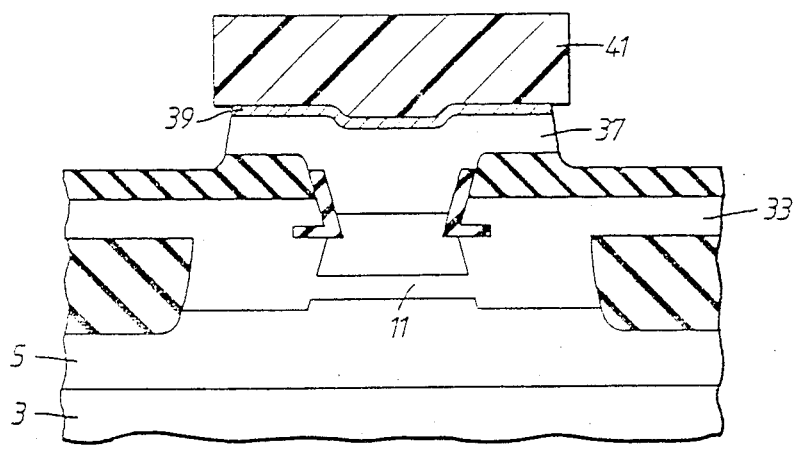

At this point, the active areas of the transistor have been defined and it only remains to provide metallised contact to them. Although the device itself may be very small, the overgrown epitaxial layers 33, 37 provide laterally extended contact areas making this a relatively simple task. There are several options here; a possible sequence is outlined in the next series of figures. After coating of the structure with an n-type contact metal 39, a photoresist mask 41 is applied and used to mask an etch defining the emitter contact (FIG. 7). The same mask may remain in situ and further etching followed by evaporation of p-type contact metal 43 will follow. After etching to the collector layer 5 to apply the remaining contact 45 an extremely compact structure (FIG. 8) is obtained.

This transistor structure can be scaled to extremely small dimensions. As outlined, the process involved one alignment step. A two-level resist type of structure may be used to eliminate this requirement.

Figure 9:
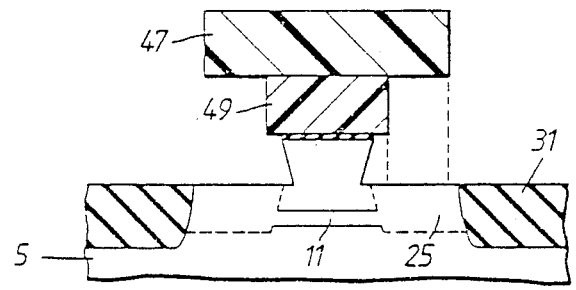
FIG. 9 is a cross-section illustrating alternative steps employed for the process above.

FIG. 9 illustrates such a structure formed from a single masking step. An upper level of resist 47 defines the isolating implant; after removal of this layer a second resist layer 49 defines the other features of the transistor self-aligned to the isolation step. This represents the ultimate in self-alignment; a single feature is employed and no alignment at all is required.

Figure 8:
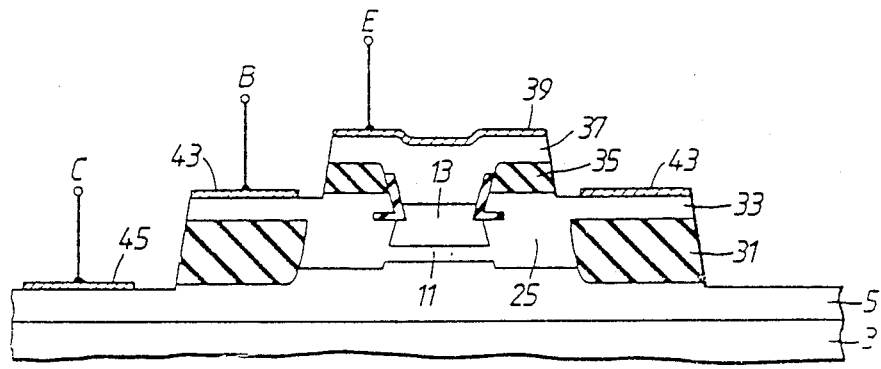
FIG. 8 is a cross-section of a bipolar transistor produced accordingly.
Figure 10:
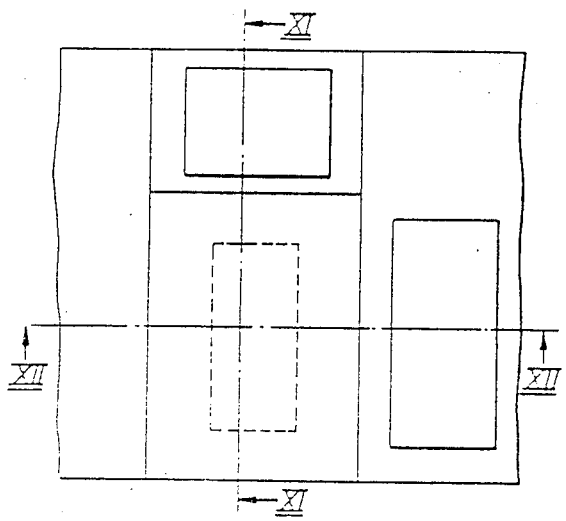
FIGS. 10, 11 and 12 show in plan view and in cross-section a bioplar transistor of modified design, and, FIGS. 13 and 14 are cross-sections showing semiconductor structure geometry at the start and the end of a process applied to the manufacture of a field effect transistor.
Figure 11:
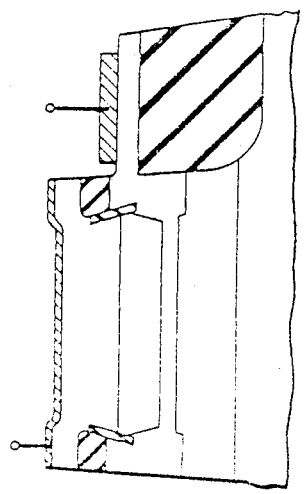
Figure 12:
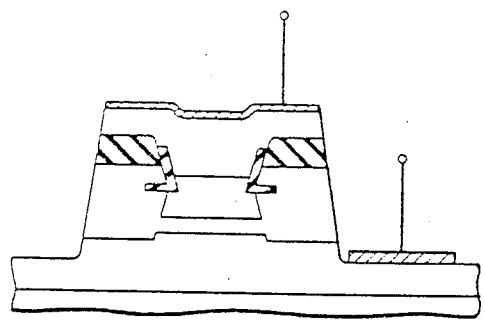
Figure 13:
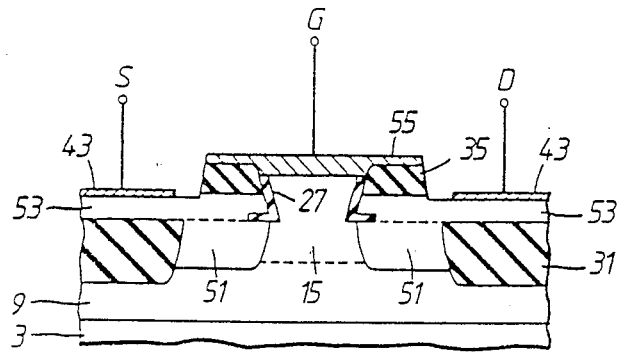
Figure 14:
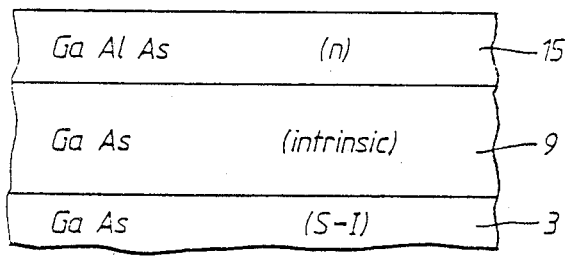

FIG. 8 is only one possible way in which the self-aligned structure may be contacted. With a transistor on this size the operating current will be small and it is likely that the resistance of the overgrown p-type layer will be sufficiently small to enable it to carry the base current without the need for a metal stripe. This enables an even smaller type of structure to be fabricated. A suitable arrangement may be as shown in FIGS. 10, 11 and 12.

The process just described serves to provide ultrasmall geometry GaAs/GaAlAs bipolar devices and this is the immediate application. Use of this type of contacting technique is not limited to the bipolar structure, however. Other materials and other devices may also profit from the extremely small geometries made possible by extended contacting.

The process may be adapted, for example, to the manufacture of III-V homostructure and heterostructure field effect transistor structures. This is illustrated in FIGS. 10 and 11. Here a semi-insulating gallium arsenide substrate 3 is provided having an epitaxially grown high-mobility undoped gallium arsenide layer 9 and a heavily-doped low-mobility gallium aluminium arsenide layer 15. In the initial stage of processing a mesa feature is formed as previously. The depth of the mesa does not extend below the thickness of the gallium aluminium arsenide layer 15. In the course of this process, n-type dopant has been implanted—see dopant regions 51, and n-type dopant enriched extended contacts 53 have been formed for the source and drain of this Schottky contact 55 is also provided. A compact p-channel high-electron mobility transistor (HEMT) is thus produced. As above, isolation is provided by sidewall insulation 27 and overgrown insulation material 35.

Although the GaAs/GaAlAs materials system has been described as example, there is no reason why other semiconductors could not be used; for example, devices could be fabricated for the InP/GaInAs materials system. It is also possible that a mixture of semiconductors could be employed—for example, the p-type extended contact overgrown on the GaAlAs could be germanium rather than GaAs (germanium is a good lattice match). In this case, it would be possible to achieve lower contact layer sheet resistance and contact resistivity. InAs or GaInAs are other alternative materials for the contact layer to the GaAs layer.

The process as described above utilised a final n-type epitaxial growth for emitter contacting; an alternative (at the expense of device performance) could be realised if an ohmic contact metallisation step was performed at this point instead (or a refractory ohmic contact deposited prior to extended p-contact growth). This could provide an intermediate structure useful in the progress towards full process implementation with very high performance.

Other component materials of the process could alter; the dielectric cited here is silox but other dielectrics (e.g. aluminium oxide, silicon nitride) could equally well be used.

Epitaxial overgrowth of the emitter during the base contact layer growth is suppressed by the silox (or other dielectric) layer; it is possible, however, that this overgrowth could be tolerated provided it could later be removed. This might, for example, be achieved by the use of careful etching of a planarising layer applied over the entire structure; the emitter, a raised feature, would be exposed first and the overlying layer could then be etched off.

An isolating implant is cited as the means to define base-collector junction area. Other methods are possible including etching, growth of native oxide, or possibly selective area epitaxial growth of the junction during fabrication of the bipolar epilayer structure. The isolating implant avoids difficulties associated with these techniques such as non-planarity of the surface and the need to isolate base and collector. Since these obstacles may be overcome, alternative junction area definition schemes are not precluded from the general scope of this invention.

What I claim is:

1. A process for the manufacture of a III-V semiconductor device, this process including the steps of:
    providing a III-V semiconductor structure;
    forming, upon a selected area of an exposed surface of this structure, a masking layer of insulating material;
    applying an etch to remove material adjacent to the masked selected area to define a step having a masked top surface, a sidewall and a lower surface;
    forming upon the insulating material, the sidewall of the step and, the lower surface of the step, a further and conformal layer of insulating material;
    applying an anisotropic etch to remove the insulating material covering the lower surface of the step whilst leaving insulating material covering the top surface and side wall of the step;
    growing a layer of lattice matched material upon the lower surface of the step, the same to provide a first extended contact region, the upper surface of this grown layer lying below the top surface of the step;
    forming, upon the surface of the grown layer, a covering layer of insulating material;
    removing insulating material to expose the top surface of the step; and,
    forming a second extended contact region lying above and in contact with the top surface of the step.

2. A process, as claimed in claim 1, wherein the III-V Semiconductor structure is of gallium arsenide and gallium aluminium arsenide materials.

3. A process, as claimed in claim 2, wherein the structure comprises the following layers:
    a semi-insulating substrate layer of gallium arsenide;
    followed by at least one layer of n-type gallium arsenide;
    followed by a layer of p-type gallium aluminium arsenide; and,
    followed by at least one layer of n-type gallium arsenide.

4. A process, as claimed in claim 3, wherein the first extended contact region is of one of the conducting, doped, materials: gallium arsenide or germanium.

5. A process, as claimed in either claims 3 or 4, wherein the second extended contact region is of one of the conducting, doped, materials: gallium arsenide, indium arsenide, or gallium indium arsenide.

6. A process, as claimed in any one of the preceding claims, wherein the insulating material is chosen from the following group of insulating materials: silicon oxide, silicon nitride, and aluminium oxide.

7. A process as claimed in claim 2, wherein the structure comprises the following layers:
    a substrate layer of semi-insulating gallium arsenide;
    followed by a layer of intrinsic gallium arsenide; and,
    followed by a layer of n-type gallium aluminium arsenide.

* * * * *